(12) United States Patent
Saikatsu et al.

(10) Patent No.: US 7,393,404 B2
(45) Date of Patent: Jul. 1, 2008

(54) PIGMENT DISPERSANTS AND THEIR USE

(75) Inventors: Hiroaki Saikatsu, Chuo-ku (JP);
Hiromitsu Yanagimoto, Chuo-ku (JP);
Naoto Kamata, Chuo-ku (JP); Kazuhito Ooki, Chuo-ku (JP); Yutaka Miura, Chuo-ku (JP); Shigeru Sakamoto, Chuo-ku (JP); Akio Yoshida, Chuo-ku (JP); Michiei Nakamura, Chuo-ku (JP)

(73) Assignee: Dainichiseika Color & Chemicals Mfg. Co., Ltd., Tokyo (JP)

( * ) Notice: Subject to any disclaimer, the term of this patent is extended or adjusted under 35 U.S.C. 154(b) by 346 days.

(21) Appl. No.: 11/354,112

(22) Filed: Feb. 15, 2006

(65) Prior Publication Data

US 2006/0185558 A1 Aug. 24, 2006

(30) Foreign Application Priority Data

Feb. 22, 2005 (JP) ............................. 2005-045347
Feb. 22, 2005 (JP) ............................. 2005-045348

(51) Int. Cl.
G03F 1/00 (2006.01)
G03F 7/09 (2006.01)
B01F 17/32 (2006.01)
C07D 487/02 (2006.01)
C08K 5/3415 (2006.01)
G02B 5/20 (2006.01)
G02B 5/22 (2006.01)
G02F 1/1335 (2006.01)
G03C 7/04 (2006.01)
C09B 67/20 (2006.01)
C09B 67/00 (2006.01)
C09B 67/22 (2006.01)
C09B 67/46 (2006.01)
C09B 57/00 (2006.01)

(52) U.S. Cl. ...................... 106/498; 106/493; 106/494; 106/495; 106/496; 106/497; 349/106; 353/84; 430/7; 430/321; 430/322; 524/92; 544/143; 548/453

(58) Field of Classification Search ................ 106/493, 106/494, 495, 496, 497, 498; 349/106; 353/84; 430/7, 321, 322; 524/92; 544/143; 548/453
See application file for complete search history.

(56) References Cited

U.S. PATENT DOCUMENTS

| 5,380,870 | A | * | 1/1995 | Hari et al. | 548/453 |
| 5,738,719 | A | * | 4/1998 | Wallquist et al. | 106/498 |
| 5,808,094 | A | * | 9/1998 | Mizuguchi et al. | 548/453 |
| 5,961,711 | A | | 10/1999 | Saikatsu et al. | |
| 6,066,202 | A | * | 5/2000 | Wallquist et al. | 106/494 |
| 6,299,676 | B1 | | 10/2001 | Saikatsu et al. | |
| 6,302,953 | B1 | | 10/2001 | Saikatsu et al. | |
| 6,409,816 | B1 | * | 6/2002 | Weber et al. | 106/494 |
| 6,471,766 | B2 | | 10/2002 | Ohki et al. | |
| 7,002,021 | B2 | * | 2/2006 | Grimm et al. | 548/305.4 |
| 7,102,014 | B2 | * | 9/2006 | Weber et al. | 548/453 |
| 7,153,358 | B2 | * | 12/2006 | Weber et al. | 106/498 |
| 7,279,514 | B2 | * | 10/2007 | Lenz et al. | 524/92 |
| 2005/0048384 | A1 | | 3/2005 | Saikatsu et al. | |
| 2006/0185558 | A1 | * | 8/2006 | Saikatsu et al. | 106/493 |
| 2007/0028807 | A1 | * | 2/2007 | Wallquist et al. | 106/494 |

FOREIGN PATENT DOCUMENTS

| DE | 40 37 556 A1 | | 5/1991 |
| EP | 0 224 445 A2 | | 6/1987 |
| EP | 1 016 694 A2 | | 7/2000 |
| EP | 1 104 789 A2 | | 6/2001 |
| GB | 2238550 A | * | 5/1991 |
| JP | 2000-160084 | | 6/2000 |
| JP | 2000-160084 A | * | 6/2000 |
| JP | 200357425 A | * | 2/2003 |

OTHER PUBLICATIONS

Byron G. Hays, "Surface Treatment of Organic Pigments for Printing Ink Applications", American Inkmaker, XP 009045503, vol. 62, No. 6, Jun. 1984, 9 pages.

* cited by examiner

*Primary Examiner*—Anthony J. Green
(74) *Attorney, Agent, or Firm*—Oblon, Spivak, McClelland, Maier & Neustadt, P.C.

(57) ABSTRACT

A pigment dispersant contains the following component (a) alone or the following components (a) and (b) in combination:

Component (a): a composite pigment formed of a diketopyrrolopyrrole pigment having a sulfonic group and another diketopyrrolopyrrole pigment having no sulfonic group, wherein the number of sulfonic group per molecule of the diketopyrrolopyrrole pigments in the composite pigment is from 0.05 to 0.5; and Component (b): a pigment other than the component (a), wherein the pigment has a sulfonic group or its metal salt, ammonium salt or amine salt.

Also disclosed are a colored composition for color filters, a process for the fabrication of a color filter, the color filter fabricated by the process, an image display device including the color filter, and an information communication equipment including the image display device. These colored composition, process, color filter, image display device and information communication equipment all make either direct or indirect use of the pigment dispersant.

14 Claims, No Drawings

PIGMENT DISPERSANTS AND THEIR USE

FIELD OF THE INVENTION

This invention relates to pigment dispersants, colored compositions for color filters useful in the fabrication of liquid-crystal color displays or image pickup devices, and color filters making use of the colored compositions. More specifically, this invention is concerned with colored compositions for color filters, said compositions being excellent in pigment dispersing ability, transparency, fluidity and storage stability, and also with color filters making use of the colored compositions.

DESCRIPTION OF THE BACKGROUND

Nowadays, color filters for use in a liquid crystal display or the like are each fabricated mainly by applying a colored composition, which is formed of a photoresist and a pigment dispersed therein, onto a substrate by a spin-coating method, coating method or transfer method, exposing the thus-applied colored composition to light, radiation or the like through a photomask, and then performing development to form pixels. Upon fabrication of such color filters, a diketopyrrolopyrrole pigment is generally used as a pigment for the formation of red pixels. Mere dispersion of this pigment together with a resin, a solvent and the like by a conventional disperser, however, cannot bring the pigment into a fully-dispersed form. When the thus-prepared dispersion is used for the formation of color pixels for the color filters (hereinafter simply called "color pixels"), the resulting red pixels lack transparency and have insufficient transmission as pixels for color filters. The red pigment is, therefore, dissatisfactory as a pigment for use in a colored composition for color filters. It is to be noted that the dispersion may mean a "colored composition for color filters" in some instances.

As resins for use in photoresists, acrylic polymers of high acid value are mainly adopted because an aqueous alkali solution can be used as a patterning developer. In a pigment dispersion composed of the above-described pigment and an acrylic resin of high acid value, however, the particles of the pigment undergo flocculation, so that the viscosity of the pigment dispersion tends to rise. Further, the pigment dispersion becomes thicker with time, and therefore, has poor storage stability in many instances.

When fabricating a color filter with such a pigment dispersion as accompanied by such difficulties as described above, the pigment dispersion is applied onto a substrate by a spin-coating method to form a colored film, and the colored film is then formed into pixels. When the viscosity of the pigment dispersion is high or when the pigment particles flocculate and the colored composition of color filters shows thixotropic viscosity, the coated layer rises at a central part thereof prior to its formation into pixels. When a large-size color filter is fabricated, this rise becomes a cause for the occurrence of differences in hue and density between the pixels formed at the central part and the pixels formed at the peripheral part of the substrate.

A colored composition for color filters (pigment dispersion) generally has a pigment concentration in a high range of from 5 to 20 wt. %. Nonetheless, the colored composition must be in a state dispersed without flocculation of pigment particles themselves, must have a viscosity (e.g., 5 to 20 mPa·s or so) lower than general room-temperature drying coating formulations or baking coating formulations, and must also be excellent in storage stability.

To meet the above-described requirements, it has conventionally been proposed that, when a red pigment is a diketopyrrolopyrrole pigment (for example, C.I. Pigment Red 254), one or more diketopyrrolopyrrole sulfonic acids, each having a degree of sulfonation of 1 or higher, be added to the pigment or the pigment be treated with the sulfonated product (JP-A-2000-160084).

On the other hand, the utility of liquid crystal displays has expanded from monitors for personal computers to color displays in color television sets, leading to a demand for further improvements in the performance of color filters. A need has, therefore, arisen for an improvement in the transparency of pixels, an increase in the contrast of light transmitted through pixels, and an increase in the concentration of pigment in pixels.

With the above-described methods which make use of the sulfonated product, however, it is difficult to improve the transparency of pixels by relying upon an improvement in the dispersibility of the pigment or to avoid an increase in the viscosity of the pigment dispersion or a reduction in its storage stability due to a rise in the pigment concentration. Further, it is difficult to control the reaction upon sulfonating the diketopyrrolopyrrole pigment. When a sulfonated product with many sulfonic groups introduced therein is used as a dispersant, foreign matter may occur in the resulting pigment dispersion. There is also an outstanding desire for improvements in these respects.

SUMMARY OF THE INVENTION

The present inventors have proceeded with an extensive investigation to solve the above-described problems, which arise when the sulfonated diketopyrrolopyrrole pigment is used in a colored pigment composition of high pigment concentration for color filters, and to achieve an improvement in the color quality of the colored composition and a reduction in the viscosity of the colored composition and also to prevent the occurrence of foreign matter in the colored composition. As a result, it has been found that use of a sulfonated composite diketopyrrolopyrrole pigment with the number of its sulfonic group controlled to 0.05 to 0.5 as a pigment dispersant makes it possible to achieve a reduction in the viscosity of a colored composition for color filters, to avoid thickening and gelling of the colored composition during its storage, to prevent the occurrence of foreign matter, and to improve the transparency of pixels. The transparency of the pixels is most important for the color filters. These findings have led to the completion of the present invention.

The above-described objects can be achieved by the present invention to be described hereinafter. Described specifically, the present invention provides a pigment dispersant comprising the below-described component (a) alone or the below-described components (a) and (b) in combination. When the components (a) and (b) are used in combination, the weight ratio (a:b) of the component (a) to the component (b) may preferably be from 10:90 to 90:10.

Component (a): a composite pigment formed of a diketopyrrolopyrrole pigment having a sulfonic group and another diketopyrrolopyrrole pigment having no sulfonic group, wherein the number of sulfonic group per molecule of the diketopyrrolopyrrole pigments in the composite pigment is from 0.05 to 0.5; and Component (b): a pigment other than the component (a), wherein the pigment has a sulfonic group or a metal salt, ammonium salt or amine salt thereof.

The component (b) may preferably be a compound represented by the below-described formula (I), formula (II), (III) or (IV) or a metal salt, ammonium salt and/or amine salt thereof, although no particular limitation is imposed thereon.

Formula (I)

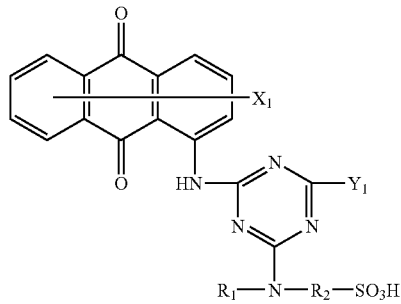

Formula (IV)

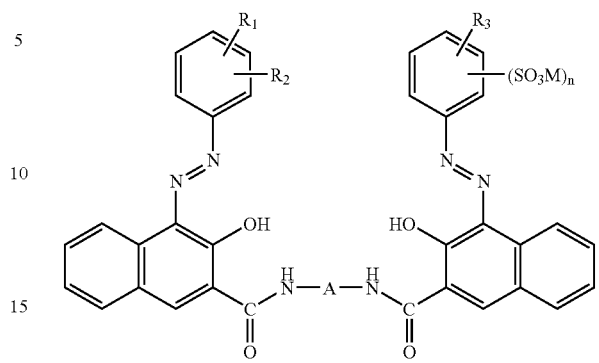

wherein $X_1$ is a hydrogen or halogen atom or an alkyl or acylamino group, $Y_1$ is an anthraquinonylamino, phenylamino, naphtylamino or phenoxy group, the groups may each include one or more halogen atoms, alkyl groups and/or acylamino groups as substituents, $R_1$ is a hydrogen atom or an alkyl or phenyl group, and $R_2$ is a substituted or unsubstituted alkylene, phenylene or naphthylene group;

wherein A is

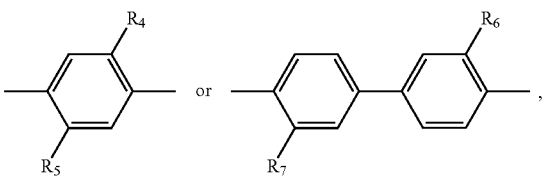

Formula (II)

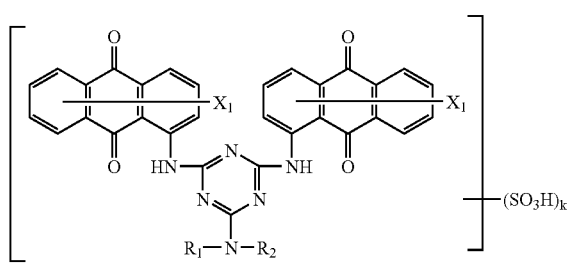

wherein $X_1$ is a hydrogen or halogen atom or an alkyl group, $R_1$ is a hydrogen atom or an alkyl or phenyl group, $R_2$ is a substituted or unsubstituted phenyl or naphthyl group, and k is an average number of sulfonic group(s) on the compound and is a number of from 0.5 to 2;

$R_1$ and $R_2$ each represents a hydrogen or halogen atom or a hydroxyl, alkyl, carboxyl, sulfonic or trifluoromethyl group, $R_3$ represents a hydrogen or halogen atom or a hydroxyl or alkyl group, $R_4$, $R_5$, $R_6$ and $R_7$ each represents a hydrogen or halogen atom or a methyl or cyano group, M represents a hydrogen or metal atom or an ammonium or amine group, and n stands for an integer of from 1 to 3.

In the dispersant according to the present invention, the diketopyrrolopyrrole pigment having no sulfonic group may preferably be represented by the below-described formula (V); and the sulfonic group in the diketopyrrolopyrrole pigment having the sulfonic group may preferably comprise at least one sulfonic group selected from a free sulfonic group and metal, amine and ammonium salts of a sulfonic group.

Formula (III)

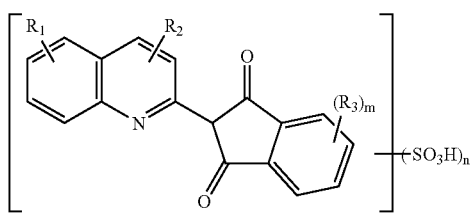

Formula (V)

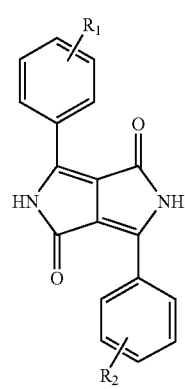

wherein $R_1$ is a hydrogen or halogen atom or a hydroxyl, alkyl, substituted or unsubstituted aryl, or substituted or unsubstituted phthalimido group, $R_2$ is a hydrogen atom or a hydroxyl group, $R_3$ is a halogen atom, m stands for an integer of from 0 to 4, and n is an average number of sulfonic group(s) introduced in the compound and is a number of from 0.5 to 4; or wherein $R_1$ and $R_2$ are each independently a hydrogen or halogen atom or a cyano, alkyl or phenyl group.

In the dispersant according to the present invention, $R_2$ in the formula (I) may preferably be a group formed by eliminating an amino group from an amine selected from taurine, N-methyltaurine, o-aminobenzenesulfonic acid, m-aminobenzenesulfonic acid, sulfanilic acid, 4-chloroaniline-3-sulfonic acid, 2-nitroaniline-4-sulfonic acid, 2-aminophenol-4-sulfonic acid, o-anisidine-5-sulfonic acid, p-anisidine-5-sulfonicacid, o-toluidine-4-sulfonicacid, m-toluidine-4-sulfonic acid, p-toluidine-2-sulfonic acid, 2-chloro-p-toluidine-3-sulfonic acid, 3-amino-6-chloro-4-sulfobenzoic acid, 1-amino-8-naphthalenesulfonic acid, 2-amino-1-naphthalenesulfonic acid, 5-amino-1-naphthalenesulfonic acid, 6-amino-1-naphthalenesulfonic acid, or 5-amino-3-naphthalenesulfonic acid.

In the dispersant according to the present invention, $R_2$ in the formula (II) may preferably be a group formed by eliminating an amino group from an amine selected from aniline, N-methylaniline, toluidine (o-, m- or p-), anisidine (o-, m- or p-), chloroaniline (o-, m- or p-), diphenylamine, 1-naphthylamine or 2-naphtylamine.

The present invention also provides a colored composition for color filters, comprising a red pigment, the above-described pigment dispersant according to the present invention, a resin dispersant, and a resin varnish. Preferably, the red pigment can be C.I. Pigment Red 254; and the resin dispersant can be a cationic resin dispersant.

In addition, the present invention also provides a process for the fabrication of a color filter, said process including a step of forming color pixels on a substrate for the color filter, which comprises forming the color pixels with the above-described colored composition according to the present invention; a color filter fabricated by the process; an image display device comprising the color filter; and an information communication equipment comprising the image display device.

According to the present invention, the synergistic effects available from the combined use of the specific dispersants as a dispersant for a colored composition, which is useful for formation of red pixels on color filters, has made it possible to more specifically prevent the flocculation of pigment particles than their single use. The colored composition can be stably prepared, and can avoid the occurrence of foreign matter. The eventual use of the colored composition as a colored composition for color filters can provide color filters, which have excellent spectral curve characteristics, can produce vivid and bright color tones, are high in transparency, and moreover, are excellent in various durabilities such as light resistance, heat resistance, solvent resistance, chemical resistance and waterproofness.

DETAILED DESCRIPTION OF THE INVENTION

The present invention will next be described in further detail based on the best mode for practicing the invention. The pigment dispersant according to the present invention comprises either the component (a) alone or the components (a) and (b) in combination.

The component (a) is a composite pigment formed of a diketopyrrolopyrrole pigment having a sulfonic group and another diketopyrrolopyrrole pigment having no sulfonic group, and the number of sulfonic group per molecule of the diketopyrrolopyrrole pigments in the composite pigment is from 0.05 to 0.5.

As an illustrative process for the preparation of the component (a), upon sulfonating a diketopyrrolopyrrole represented by the below-described formula (V), for example, C.I. Pigment Red 254 with a sulfonating agent such as fumed sulfuric acid, the sulfonation conditions are adjusted such that the number of sulfonic group to be introduced in the diketopyrrolopyrrole pigment falls within the above-described range.

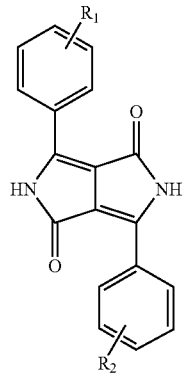

Formula (V)

wherein $R_1$ and $R_2$ are each independently a hydrogen or halogen atom or a cyano, alkyl or phenyl group.

If the number of sulfonic group in the sulfonated compound becomes greater than 0.5, the target pigment dispersant can be obtained by mixing the unsulfonated diketopyrrolopyrrole pigment with the sulfonated compound such that the average number of sulfonic group falls within the range of from 0.05 to 0.5, dissolving the resulting mixture in concentrated sulfuric acid, pouring the thus-prepared solution into iced water to cause a composite product to precipitate, and washing the composite product with water and then drying it.

The composite product in which the number of sulfonic group has been adjusted to 0.05 to 0.5 has been significantly lowered in its compatibility with and its solubility in water or solvents so that the composite product shows the behavior of practically insoluble or sparingly soluble pigments. Presumably, molecules of the unsulfonated diketopyrrolopyrrole pigment added to molecules of the sulfonated diketopyrrolopyrrole pigment are deposited on (precipitated as eutectic crystals on, or mixed with) the sulfonated diketopyrrolopyrrole molecules, and as a result, the compatibility or solubility of the sulfonated diketopyrrolopyrrole molecules with or in water is lowered.

The sulfonic group in the composite diketopyrrolopyrrole pigment can be free or can be a salt with a base. Examples of a metal which forms a salt include alkali metals such as Li, Na and K, and multivalent metals such as Ca, Ba, Al, Mn, Sr, Mg and Ni. On the other hand, examples of an amine which forms an amine salt or ammonium salt include (mono, di or tri) alkylamines, substituted or unsubstituted alkylenediamines, alkanolamines, alkylammonium chlorides, and ammonia.

The component (b) is a pigment other than the component (a), wherein the pigment has a sulfonic group or a metal salt, ammonium salt or amine salt thereof. Such pigments known to date are all usable, but the component (b) may preferably be a compound represented by the formula (I), formula (II), formula (III) or formula (IV), and/or its metal salt, ammonium salt and/or amine salt.

The compound represented by the formula (I) can be obtained by reacting one mole (1 mole) of a substituted or unsubstituted 1-aminoanthraquinone, one mole (1 mole) of any of a substituted or unsubstituted aniline, a substituted or unsubstituted phenol or a substituted or unsubstituted 1-aminoanthraquinone, and one mole (1 mole) of cyanuric chloride in an inert solvent such as o-dichlorobenzene at 130° C. to 170° C. for 2 to 6 hours, and further, reacting an aliphatic amine or aromatic amine, which contains one sulfonic group, (1 mole) at 150° C. to 170° C. for 3 to 4 hours.

Examples of the aliphatic amine or aromatic amine, which contains one sulfonic group and is useful for the production of the compound of the formula (I), include taurine, N-methyltaurine, o-aminobenzenesulfonic acid, m-aminobenzenesulfonic acid, sulfanilic acid, 4-chloroaniline-3-sulfonic acid, 2-nitroaniline-4-sulfonic acid, 2-aminophenol-4-sulfonic acid, o-anisidine-5-sulfonic acid, p-anisidine-5-sulfonicacid, o-toluidine-4-sulfonicacid, m-toluidine-4-sulfonic acid, p-toluidine-2-sulfonic acid, 2-chloro-p-toluidine-3-sulfonic acid, 3-amino-6-chloro-4-sulfobenzoic acid, 1-amino-8-naphthalenesulfonic acid, 2-amino-1-naphthalenesulfonic acid, 5-amino-1-naphthalenesulfonic acid, 6-amino-1-naphthalenesulfonic acid, and 5-amino-3-naphthalenesulfonic acid.

The compound represented by the formula (II) can be obtained by reacting a substituted or unsubstituted aminoanthraquinone (2 moles) and cyanuric chloride (1 mole) in an inert solvent such as o-dichlorobenzene at 130° C. to 170° C. for 2 to 6 hours, adding an aromatic amine—which aromatic amine contains no sulfonic group—(1 mole) and reacting it at 150° C. to 170° C. for 3 to 4 hours, and then sulfonating the reaction product with a sulfonating agent such as fumed sulfuric acid.

Examples of the aromatic amine useful for the production of the compound of the formula (II) include aniline, N-methylaniline, toluidine (o-, m- or p-), anisidine (o-, m- or p-), chloroaniline (o-, m- or p-), diphenylamine, 1-naphthylamine and 2-naphtylamine.

The compound represented by the formula (III) can be obtained by sulfonating a quinophthalone compound, which can be readily synthesized from a substituted or unsubstituted phthalic anhydride and a substituted or unsubstituted quinaldine, with a sulfonating agent such as fumed sulfuric acid.

In the formula (III), $R_1$ is a hydrogen or halogen atom or a hydroxyl, alkyl, substituted or unsubstituted aryl, or substituted or unsubstituted phthalimido group, $R_2$ is a hydrogen atom or a hydroxyl group, $R_3$ is a halogen atom, m stands for an integer of from 0 to 4, and n is the average number of sulfonic group(s) introduced in the compound and is a number of from 0.5 to 4. The term "alkyl group" indicates a linear or branched alkyl group having approximately 1 to 8 carbon atoms such as methyl, ethyl, n-propyl, isopropyl, n-butyl, isobutyl or t-butyl. The term "aryl group" indicates, for example, an aromatic hydrocarbon group such as phenyl, naphthyl, biphenyl, anthranyl or phenanthryl. These groups may be unsubstituted or substituted. Examples of such substituents can be, but not particularly limited to, halogen atoms, hydroxyl groups and alkyl groups.

The compound represented by the formula (IV) can be obtained by reacting the acid chloride of a substituted or unsubstituted 3-hydroxy-2-naphthoic acid with 1,4-phenylenediamine, which may contain substituents at the 2,5-positions thereof, or benzidine, which may contain substituents at the 3,3'-positions thereof, in an inert solvent such as nitrobenzene at 130 to 135° C., and then diazotizing and coupling a substituted or unsubstituted aminobenzenesulfonic acid and a substituted or unsubstituted aniline by methods known per se in the art, respectively.

Examples of the metals, which form metal salts with the compounds represented by the formula (I) to the formula (IV), include alkali metals such as Li, Na and K and multivalent metals such as Ca, Ba, Al, Mn, Sr, Mg and Ni. On the other hand, examples of the amines which form amine salts with the compounds represented by the formula (I) to the formula (IV) include (mono, di or tri)alkylamines, substituted or unsubstituted alkylenediamines, alkanolamines, and alkylammonium chlorides.

The component (a) can be used singly as a dispersant, and as an alternative, the component (a) can also be used in combination with the compound represented by one of the formula (I) to the formula (IV) (the component (b)). When the component (a) and the component (b) are used in combination, the weight ratio of the component (a) to the component (b), the component (a):the compound (b), can be from 10:90 to 90:10, preferably from 40:60 to 60:40. Use of the component (a) in an amount outside the above-described range is unable to sufficiently lower the viscosity of the dispersion, and leads to a reduction in the stability of the dispersion.

The colored composition according to the present invention for color filters is composed of a pigment, the above-described pigment dispersion, a resin dispersant (a dispersant made of a high molecular compound and adapted to disperse the pigment), and a resin varnish. The pigment for use in the present invention can be a diketopyrrolopyrrole pigment as a red pigment. As such a red pigment, C.I. Pigment Red 254 or the like can be mentioned. Upon preparation of the colored composition, a yellow pigment may be added and dispersed to correct the color. As such a yellow pigment, isoindoline pigment (C.I. Pigment Yellow 139) or the like can be used. The red pigment can be used generally in a proportion of from 5 to 500 parts by weight per 100 parts by weight of a resin binder in the below-descried rein varnish, although no particular limitation is imposed on the amount of the red pigment to be used.

As the ratio of the pigment dispersant to the pigment, the pigment dispersant may be added preferably at a ratio of from 0.05 to 40 parts by weight, more preferably at a ratio of from 0.1 to 10 parts by weight per 100 parts by weight of the pigment. An unduly small proportion of the dispersant makes it difficult to sufficiently bring about the intended advantageous effects of the dispersant. An excessively large proportion of the dispersant, on the other hand, cannot bring about its advantageous effects as much as the excessively large proportion used, but on the contrary, the resulting colored composition for color filters is lowered in various physical properties, and moreover, the color hue of the pigment to be dispersed is substantially changed by the color which the dispersant itself has.

As the resin dispersant for use in the present invention, a known dispersant can be used, with a cationic resin dispersant being particularly preferred. Examples of the cationic resin dispersant include "DISPER BYK-160", "DISPER BYK-161", "DISPER BYK-162", "DISPER BYK-163", "DISPER BYK-164", "DISPER BYK-166", "DISPER BYK-171", "DISPER BYK-182", "DISPER BYK-184", "DISPER BYK-2000", "DISPER BYK-2001", "DISPER BYK-2070", and "DISPER BYK-2150" (trade names, products of BYK-Chemie GmbH, Germany); "EFKA-44", "EFKA-46", "EFKA-47", "EFKA-48", "EFKA-4010", "EFKA-4050", "EFKA-4055", "EFKA-4020", "EFKA-4015", "EFKA-4060", "EFKA-4300", "EFKA-4330", "EFKA-4400", "EFKA-4406", "EFKA-4510", and "EFKA-4800" (trade names, product of EFKA Additive BV, the Netherlands); "SOLSPERS-24000", "SOLSPERS-32550" and "NBZ-4204/10" (trade names, products of Avecia Limited United Kingdom, England); "HINOACT T-6000", "HINOACT T-7000", and "HINOAC T-8000" (trade names, products of Kawaken Fine Chemicals Co., Ltd.); "AJISPUR PB-821", "AJISPUR PB-822", and "AJISPUR PB-823" (trade names, products of Ajinomoto Co., Ltd.); and "FLORENE DOPA-17HF", "FLORENE DOPA-15BHF", "FLORENE DOPA- 33", and "FLORENE DOPA-44" (trade name, products of Kyoeisha Chemical Co., Ltd.).

The amount of the resin dispersant to be used in the present invention may be preferably from 2 to 100 parts by weight, more preferably from 10 to 50 parts by weight per 100 parts by weight of the pigment, although no particular limitation is imposed thereon. An amount of the resin dispersant smaller than 2 parts by weight cannot provide the pigment with good dispersion stability, while an amount of the resin dispersant greater than 100 parts by weight may lead, in some instances, to a colored composition for color filters, which cannot form films of good developability.

As the resin varnish employed as a dispersion medium for dispersing the pigment in the present invention, known resin varnishes conventionally used in colored compositions in color filters are all usable, and no particular limitation is imposed thereon. In the resin varnish as a dispersion medium, an appropriate solvent or water-based medium is usable. Further, conventionally-known additives, for example, a dispersing aid, a leveling agent, a bonding agent and the like can be added and used suitably as needed.

As the resin varnish, either a photosensitive resin varnish or a non-photosensitive resin varnish can be used. Examples of the photosensitive resin varnish include photosensitive resin varnishes useful in ultraviolet-curable inks and electron-radiation-curable inks. Examples of the non-photosensitive resin varnish, on the other hand, include resin varnishes useful in printing inks such as letterpress inks, lithographic inks, intaglio gravure inks and stencil screen inks; resin varnishes useful for inkjet printing; resin varnishes useful for electrocoating; resin varnishes useful in developers for electric printing and electrostatic printing; and resin varnishes useful in thermal transfer films or ribbons.

Specific examples of the photosensitive resin varnish include varnishes such as photosensitive cyclic rubber resins, photosensitive phenol resins, photosensitive polyacrylate resins, photosensitive polyamide resins, photosensitive polyimide resins and the like, more specifically unsaturated polyester resins, polyester acrylate resins, polyepoxy acrylate resins, polyurethane acrylate resins, polyether acrylate resins, polyol acrylate resins and the like; and varnishes prepared by adding monomers as reactive diluents to such resins. As preferred resins among the above-described photosensitive resin varnishes, alkali-developable acrylate resins containing free carboxyl groups in their molecules can be mentioned.

Specific examples of the non-photosensitive resin varnish include cellulose acetate resins, nitrocellulose resins, styrene (co)polymers, polyvinyl butyral resins, aminoalkyd resins, polyester resins, amino-resin-modified polyester resins, polyurethane resins, acrylic polyol urethane resins, soluble polyamide resins, soluble polyimide resins, soluble polyamide-imide resins, soluble polyester-imide resins, hydroxyethylcellulose, water-soluble salts of styrene-maleate ester copolymers, water-soluble salts of (meth)acrylate ester (co) polymers, water-soluble aminoalkyd resins, water-soluble aminopolyester resins, and water-soluble polyamide resins. They can be used either singly or in combination.

No particular limitation is imposed on the method for the preparation of the colored composition—according to the present invention—formed of the above-described respective components. As illustrative, however, the following methods can be mentioned:

(a) After the pigment and pigment dispersant are dissolved in sulfuric acid or the like, the resulting solution is poured into water such that both of them are allowed to precipitate as a solid solution. The solid solution is then added together with the cationic resin dispersant to the resin varnish, followed by kneading.

(b) The pigment is evenly suspended in water or an organic solvent. A solution with the pigment dispersant contained therein is added to the suspension to have the pigment dispersant precipitated on the surfaces of the pigment particles. The pigment particles with the pigment dispersant precipitated thereon is added together with the cationic resin dispersant to the resin varnish, and the resulting mass is kneaded.

(c) The pigment, pigment dispersant and cationic resin dispersant are finely dispersed in a wet-type, medium-containing disperser such as an attritor or ball mill. The resin varnish is then added, followed by kneading.

(d) The pigment, pigment dispersant and cationic resin dispersant are added to the resin varnish at the time of pre-mixing, and the resulting mixture is subjected to dispersion processing in a wet-type, medium-containing disperser.

When a photosensitive resin varnish is used as a resin varnish upon fabrication of color filters with the colored composition according to the present invention, a conventionally-known, photopolymerization initiator such as benzoin ethyl ether or benzophenone is added to the composition, the thus-obtained mass is kneaded by a conventionally-known method, and the resulting colored photosensitive composition is then used. It is to be noted that the colored composition according to the present invention can also be used as a thermopolymerizable colored composition by using a thermopolymerization initiator in place of the above-described photopolymerization initiator.

Upon forming pixels for a color filter on a substrate by using the above-described photosensitive colored composition, a transparent substrate is subjected to full-area coating with the photosensitive colored composition, for example, by using a spin coater, a low-speed rotary coater, a roll coater, a knife coater or the like, or by suitable one of various printing process, the transparent substrate is subjected to full-area printing or is subjected to partial-area printing at areas somewhat greater than pixels. Subsequent to pre-drying, a photomask is brought into close contact with the coated or printed surface of the transparent substrate, and using an extra-high pressure mercury vapor lamp, exposure is then conducted to bake the pixels. Subsequently, development and washing are conducted, and post-baking is carried out as needed, to form the pixels. This process itself for the formation of pixels is known to the public, and no particular limitation is imposed on the formation process of pixels for color filters.

Upon forming pixels for a color filter with a colored composition (non-photosensitive colored composition) of this invention which makes use of a non-photosensitive resin varnish, for example, the non-photosensitive colored composition can be printed as a printing ink for the color filter on the transparent substrate by suitable one of the above-described various printing processes to form the pixels on the substrate, can be applied as a water-based electrocoating composition onto the transparent substrate by an electrocoating process to form the pixels on the substrate, can be printed as an inkjet ink on the transparent substrate by an inkjet printing process to form the pixels on the substrate, or can be applied onto a transfer substrate by an electroprinting process, an electrostatic printing process or one of the above-described processes or by a like process to once form pixels, and then the formed pixels are transferred onto a substrate for the color filter. Subsequently, by methods known per se in the art, baking may be conducted, polishing may be conducted to level the surface, and/or top coating may be conducted to protect the surface, as needed. Further, a black matrix is formed by a method known per se in the art. In this manner, a color filter having R, G and B pixels can be obtained. These fabrication processes for color filters are by themselves known to the public, and in the present invention, no particular limitation is imposed on the fabrication process of color filters.

EXAMPLES

Based on Synthesis Examples, Examples and Comparative Examples, the present invention will next be described more specifically. It is to be noted that all designations of "part", "parts" and "%" are on a weight basis.

Synthesis Example A1

A diketopyrrolopyrrole pigment (C.I. Pigment Red 254, 30 parts) was added to 20% fumic sulfuric acid (300 parts), followed by a reaction at 60 to 65° C. for 6 hours. Subsequent to cooling, the precipitation of a composite according to the present invention was caused from the resultant mixture in iced water (3,000 parts). The formed precipitate was collected by filtration and then washed with water to obtain a water-based paste (110 parts, true amount: 28 parts). The water-based paste was dried to obtain a diketopyrrolopyrrole (a pigment dispersant A1, 28 parts), which was determined to contain on average 0.8 sulfonic group introduced per molecule from the results of an elemental analysis for sulfur.

Further, the pigment dispersant A1 (5 parts) and C.I. Pigment Red 254 (5 parts) were added to 95% sulfuric acid (100 parts), followed by stirring at room temperature for 1 hour. Subsequent to cooling, the resulting concentrated-sulfuric acid solution was poured into iced water (1,000 parts); its pouring led to the precipitation of a composite according to the present invention. The formed precipitate was collected by filtration and then washed with water to obtain a water-based paste (39 parts, true amount: 10 parts). The water-based paste was dried to obtain a diketopyrrolopyrrole (a pigment dispersant A2, 10 parts), which was determined to contain on average 0.4 sulfonic group introduced per molecule from the results of an elemental analysis for sulfur.

Synthesis Example A2

The pigment dispersant A1 of Synthesis Example A1 (3.75 parts) and C.I. Pigment Red 254 (6.25 parts) were added to 95% sulfuric acid (100 parts), followed by stirring at room temperature for 1 hour. Subsequent to cooling, the resulting concentrated sulfuric acid solution was poured into iced water (1,000 parts); its pouring led the precipitation of a composite according to the present invention. The formed precipitate was collected by filtration and then washed with water to obtain a water-based paste (39 parts, true amount: 10 parts). The water-based paste was dried to obtain a diketopyrrolopyrrole (a pigment dispersant A3, 10 parts), which was determined to contain on average 0.3 sulfonic group introduced per molecule from the results of an elemental analysis for sulfur.

Synthesis Example A3

Using the pigment dispersant A1 of Synthesis Example A1 (2.5 parts) and C.I. Pigment Red 254 (7.5 parts), a diketopyrrolopyrrole (a pigment dispersant A4, 10 parts) was obtained in a similar manner as in Synthesis Example A2; the pigment dispersant A4 was determined to contain on average 0.2 sulfonic group introduced per molecule from the results of an elemental analysis for sulfur.

Synthesis Example A4

A diketopyrrolopyrrole pigment (C. I. Pigment Red 254, 30 parts) was added to 20% fumic sulfuric acid (300 parts), followed by a reaction at 45 to 50° C. for 6 hours. Subsequent to cooling, the resulant mixture was caused to precipitate in iced water (3,000 parts). The precipitate was collected by filtration and then washed with water to obtain a water-based paste (110 parts, true amount: 28 parts). The water-based paste was dried to obtain a diketopyrrolopyrrole (a pigment dispersant A5, 28 parts), which was determined to contain on average 0.4 sulfonic group introduced per molecule from the results of an elemental analysis for sulfur.

Example A1

To an acrylic resin varnish (a copolymerization product of methacrylic acid, butyl acrylate, styrene and hydroxyethyl acrylate at a molar ratio of 25/50/15/10, molecular weight: 12,000, solid content: 30%; 50 parts), C.I. Pigment Red 254 (20 parts), an isoindoline yellow pigment (C.I. Pigment Yellow 139, 4 parts), the pigment dispersant A2 (1 part) obtained in Synthesis Example A1, a cationic resin dispersant ("DISPER BYK-2000", 4 parts) and a solvent (propylene glycol monomethyl ether acetate, hereinafter abbreviated as "PGMAc"; 20 parts) were added. Subsequent to premixing, the resultant mixture was dispersed in a horizontal bead mill to obtain a red-colored composition for color filters.

Examples A2-A4

Red-colored compositions for color filters were obtained in a similar manner as in Example A1 except that instead of the pigment dispersant A2, the pigment dispersants A3 to A5 obtained in Synthesis Examples A2 to A4 were used, respectively.

Comparative Example A1

A red-colored composition for color filters was obtained in a similar manner as in Example A1 except that instead of the pigment dispersant A2 obtained in Synthesis Example A1, the pigment dispersant A1 obtained in Synthesis Example A1 was used.

The colored compositions of Examples A1 to A4 were compared in fluidity, the gloss of a color-coated surface and the occurrence or non-occurrence of foreign matter with that of Comparative Example A1. With respect to each colored composition for color filters, its fluidity and its gloss of a color-coated surface were measured in accordance with the below-described methods, respectively, and further, it was observed by the below-described method to determine whether or not foreign matter existed. The measurement and observation results of the colored compositions of Examples A1 to A4 both before and after their storage at room temperature for 1 month were assessed relative to those of the colored composition of Comparative Example A1.

Fluidity:

Using an E-type viscometer, the fluidity of each colored composition for color filters was measured under the conditions of room temperature (25° C.) and 6 rpm rotor speed.

Gloss:

Using a bar coater (thickness of wiring: 0.45 mm), the colored compositions for color filters were separately coated on polypropylene films, and the glosses of the color-coated surfaces were compared visually and by a glossimeter. Those high in gloss were ranked good, and the comparison results were indicated in accordance with the following ranking indexes.

A: Good
B: Fair
C: Poor

Observation for Foreign Matter

Each colored composition for color filters was applied onto a glass substrate by a spinner. After dried into a film at 90° C. for 2 minutes, the film was observed for any foreign matter at 200-folds magnification under a microscope. The observation results were indicated in accordance with the following ranking indexes.

A: No foreign matter
B: Some foreign matter
C: Substantial foreign matter

The above measurement and ranking results are shown in Table A1.

TABLE A1

| Colored composition for color filters | Pigment dispersant # | Ave. # of sulfonic group | Viscosity (mPa·s) Before storage | After storage | Gloss Before storage | After storage | Observation for foreign matter Before storage | After storage |
|---|---|---|---|---|---|---|---|---|
| Ex. A1 | A2 | 0.4 | 24 | 27 | A | A | A | A |
| Ex. A2 | A3 | 0.3 | 22 | 23 | A | A | A | A |
| Ex. A3 | A4 | 0.2 | 22 | 23 | A | A | A | A |
| Ex. A4 | A5 | 0.4 | 25 | 28 | A | A | A | A |
| Comp. Ex. A1 | A1 | 0.8 | 26 | 170 | B | C | B | C |

As clearly envisaged from Table A1, the colored compositions of Examples A1 to A4, in which the pigment dispersants A2 to A5 were used, respectively, were lower in the viscosity after storage (one month later) and better in gloss in comparison with the colored composition of Comparative Example A1 in which the pigment dispersant A1 was used; those compositions were free from the occurrence of foreign matter both before and after the storage although the comparative composition was not free from the occurrence, and therefore, were provided with excellent properties as colored compositions for color filters.

Referential Example A1

To an acrylic resin varnish (50 parts) of the same kind as that used in Example A1, a brominated and chlorinated phthalocyanine green (C.I. Pigment Green 36, 17 parts), a quinophthalone yellow pigment (C.I. Pigment Yellow 138, 13 parts), a monosulfonated quinophthalone yellow (2 parts) as a pigment dispersant, a cationic resin dispersant ("DISPER BYK-2000", 4 parts) and PGMAc (20 parts) were added. Subsequent to premixing, the resultant mixture was dispersed in a horizontal bead mill to obtain a green-colored composition for color filters.

Referential Example A2

To an acrylic resin varnish (50 parts) of the same kind as that used in Example A1, ε-copper phthalocyanine blue (C.I. Pigment Blue 15:6, 16 parts), dioxaneviolet (C.I. Pigment Violet 23, 4 parts), monosulfonated phthalocyanine blue (2 parts) as a pigment dispersant, monosulfonated indanthrone (1 part), a cationic resin dispersant ("DISPER BYK-2000", 4 parts) and PGMAc (20 parts) were added. Subsequent to premixing, the resultant mixture was dispersed in a horizontal bead mill to obtain a blue-colored composition for color filters.

Example A5

To fabricate an RGB color filter, a red-, green- and blue-colored compositions were obtained in accordance with the formulations shown below in Table A2.

TABLE A2

| | Formulation (parts) | | |
|---|---|---|---|
| | R | G | B |
| Red-colored composition of Example A1 | 100 | — | — |
| Green-colored composition of Referential Example A1 | — | 100 | — |

TABLE A2-continued

| | Formulation (parts) | | |
|---|---|---|---|
| | R | G | B |
| Blue-colored composition of Referential Example A2 | — | — | 100 |
| Acrylic resin varnish | 50 | 50 | 50 |
| Trimethylolpropane acrylate | 10 | 10 | 10 |
| 2-Hydroxy-2-methylpropiophenone | 2 | 2 | 2 |
| 2,2-Diethoxyacetophenone | 1 | 1 | 1 |
| PGMAc | 37 | 37 | 37 |
| Total | 200 | 200 | 200 |

A glass substrate which had been treated with a silane coupling agent was set on a spin coater, and the red-colored composition in Table A2 was spin-coated under the conditions of at 300 rpm for 5 seconds firstly and at 1,200 rpm for 5 seconds secondly. Prebaking was then conducted at 80° C. for 10 minutes, a photomask having a mosaic-form pixel pattern was brought into close contact with the prebaked film, and using an extra-high pressure mercury vapor lamp, exposure was then conducted at a light quantity of 100 mJ/cm². Development and washing were then conducted with an exclusive developer and an exclusive rinse, respectively, to form red-colored mosaic pixels on the glass substrate. Subsequently, green-colored mosaic pixels and blue-colored mosaic pixels were formed by using the green-colored composition and blue-colored composition in Table A2 and conducting their coating and baking in a similar manner as described above. As a results, a color filter having R, G and B pixels was obtained. The thus-obtained color filter had excellent spectral curve characteristics, was excellent in the durabilities such as light resistance and heat resistance of the respective pixels, was also superb in light transmission properties, and exhibited outstanding properties as a color filter for a liquid-crystal color display.

Synthesis Example B1

To nitrobenzene (1,000 parts), 1-aminoanthraquinone (72 parts) and cyanuric chloride (30 parts) were added, followed by stirring at 170° C. for 5 hours. After cooling, taurine (41 parts) and potassium carbonate (23 parts) were added and the resulting mixture was stirred at 180° C. for 8 hours. Subsequent to cooling, the resultant precipitate was collected by filtration, washed with alcohol, and then deflocculated in water. The thus-prepared aqueous mixture was acidified with hydrochloric acid. The precipitate was collected by filtration, washed with water, and then dried to obtain the below-described compound B1 (94 parts).

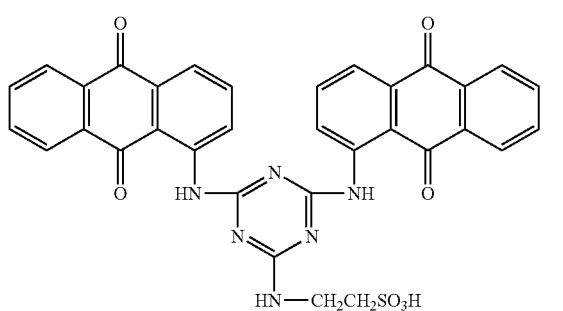

Compound B1

Synthesis Example B2

To nitrobenzene (1,000 parts), 1-aminoanthraquinone (72 parts) and cyanuric chloride (30 parts) were added, followed by stirring at 170° C. for 5 hours. After cooling, sulfanilic acid (56 parts) and potassium carbonate (23 parts) were added and the resulting mixture was stirred at 180° C. for 12 hours. Subsequent to cooling, the resultant precipitate was collected by filtration, washed with alcohol, and then deflocculated in water. The thus-prepared aqueous mixture was acidified with hydrochloric acid. The precipitate was collected by filtration, washed with water, and then dried to obtain the below-described compound B2 (101 parts).

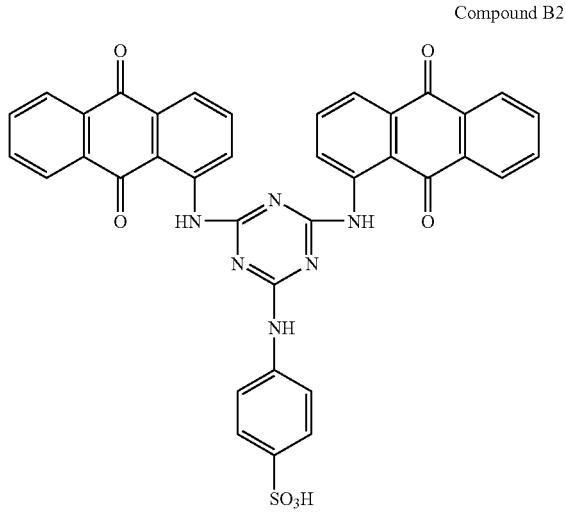

Compound B2

Synthesis Example B3

To o-dichlorobenzene (1,100 parts), 1-aminoanthraquinone (73 parts) and cyanuric chloride (30 parts) were added, followed by stirring at 170° C. for 5 hours. After cooling, o-toluidine (35 parts) was added and the resulting mixture was stirred at 180° C. for 5 hours. Subsequent to cooling, the resultant precipitate was collected by filtration, washed with alcohol, washed with water, and then dried to obtained 2,4-bis(1-anthraquinonylamino)-6-tolylamino-1,3,5-triazine (94 parts). That compound (94 parts) was added to 5% fumic sulfuric acid (800 parts) at 10° C, or lower, followed by a reaction at 30° C. for 5 hours. Subsequent to cooling, the resultant mixture was caused to precipitate in iced water (2,500 parts) The precipitate was collected by filtration, and then washed with water to obtain the below-described compound B3 (102 parts), which was determined to contain on average 0.9 sulfonic group introduced per molecule from the results of an elemental analysis for sulfur.

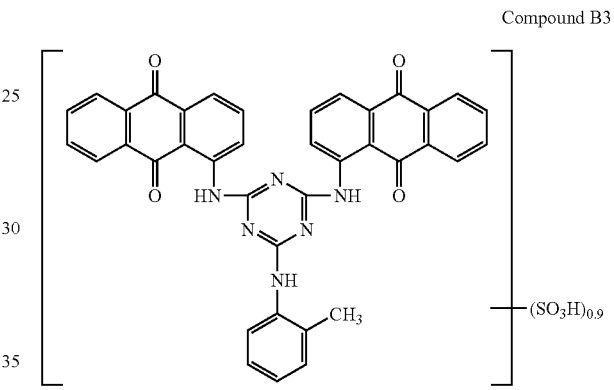

Compound B3

Example B1

To an acrylic resin varnish (a copolymerization product of methacrylic acid, butyl acrylate, styrene and hydroxyethyl acrylate at a molar ratio of 25/50/15/10, molecular weight: 12,000, solid content: 30%)(50 parts), a diketopyrrolopyrrole pigment (C.I. Pigment Red 254, 20 parts), an isoindoline yellow pigment (C.I. Pigment Yellow 139, 4 parts), the compound B1 (1 part) obtained in Synthesis Example B1, the pigment dispersant A5 (1 part) obtained above in Synthesis Example A4, a cationic resin dispersant ("DISPER BYK-2000", 4 parts) and "PGMAc" (20 parts) were added. Subsequent to premixing, the resultant mixture was dispersed in a horizontal bead mill to obtain a red-colored composition for color filters.

Example B2

A red-colored composition for color filters was obtained in a similar manner as in Example B1 except that instead of the compound B1, the compound B2 of Synthesis Example B2 was used.

Example B3

A red-colored composition for color filters was obtained in a similar manner as in Example B1 except that instead of the compound B1, the compound B3 of Synthesis Example B3 was used.

Comparative Example B1

A red-colored composition for color filters was obtained in a similar manner as in Example B1 except that the pigment dispersant A5 was not used and only the compound B1 was used.

Comparative Example B2

A red-colored composition for color filters was obtained in a similar manner as in Example B1 except that the pigment dispersant A5 was not used and only the compound B2 was used.

Comparative Example B3

A red-colored composition for color filters was obtained in a similar manner as in Example B1 except that the pigment dispersant A5 was not used and only the compound B3 was used.

The colored compositions of Examples B1 to B3 were compared in fluidity and the gloss of a color-coated surface with those of Comparative Examples B1 to B3. With respect to each colored composition for color filters, its fluidity and its gloss of a color-coated surface were measured by the same methods as those described above. The measurement results of the colored compositions of Examples B1 to B3 were assessed relative to those of the colored compositions of Comparative Examples B1 to B3. The results of the above measurements and assessment are shown in Table B1.

TABLE B1

| Colored composition for color filters | Pigment dispersant | Viscosity (mPa·s) Before storage | Viscosity (mPa·s) After storage | Gloss After storage |
|---|---|---|---|---|
| Ex. B1 | B1 + A5 | 10 | 11 | A |
| Ex. B2 | B2 + A5 | 9 | 9 | A |
| Ex. B3 | B3 + A5 | 12 | 12 | A |
| Comp. Ex. B1 | B1 | 49 | 120 | C |
| Comp. Ex. B2 | B2 | 46 | 78 | B |
| Comp. Ex. B3 | B3 | 47 | 66 | B |

As clearly envisaged from Table B1, the colored compositions of Examples B1 to B3, in which the compounds B1 to B3 were used in combination with the pigment dispersant A5, respectively, were lower in the viscosity both before and after storage (one month later) and better in gloss in comparison with the colored compositions of Comparative Examples B1 to B3 in which the compounds B1 to B3 were used singly, and therefore, were provided with excellent properties as colored compositions for color filters.

Example B4

To fabricate an RGB color filter, a red-, green- and blue-colored compositions were obtained in accordance with the formulations shown below in Table B2.

TABLE B2

| | Formulation (parts) | | |
|---|---|---|---|
| | R | G | B |
| Red-colored composition of Example B1 | 100 | — | — |
| Green-colored composition of Referential Example A1 | — | 100 | — |
| Blue-colored composition of Referential Example A2 | — | — | 100 |
| Acrylic resin varnish | 50 | 50 | 50 |
| Trimethylolpropane acrylate | 10 | 10 | 10 |
| 2-Hydroxy-2-methylpropiophenone | 2 | 2 | 2 |
| 2,2-Diethoxyacetophenone | 1 | 1 | 1 |
| PGMAc | 37 | 37 | 37 |
| Total | 200 | 200 | 200 |

Subsequently, a color filter having R, G and B pixels was obtained in a similar manner as in Example A5. The thus-obtained color filter had excellent spectral curve characteristics, was excellent in the durabilities such as light resistance and heat resistance, was also superb in light transmission properties, and exhibited outstanding properties as a color filter for a liquid-crystal color display.

Synthesis Example C1

Tetrachloroquinophthalone (50 parts) was added to 20% fumic sulfuric acid (250 parts), followed by a reaction at 80° C. for 6 hours. Subsequent to cooling, the resulting mixture was caused to precipitate in iced water (2,000 parts). The precipitate was collected by filtration and then washed with water to obtain a water-based paste (280 parts, true amount: 55 parts) of the below-described compound C1. The water-based paste was dried to collect the compound C1 (55 parts), which was determined to contain on average 1.3 sulfonic groups introduced per molecule from the results of an elemental analysis for sulfur.

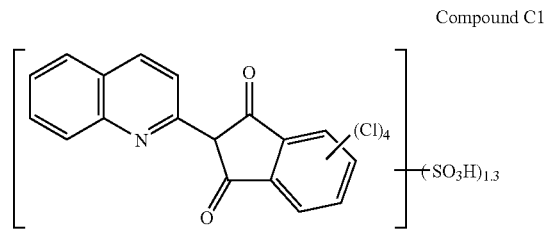

Compound C1

Synthesis Example C2

Water (240 parts) was added to a paste (90 parts) of the compound C1 (true amount: 18 parts) of Synthesis Example C1, followed by stirring at 25° C. for 1 hour. To the resulting mixture, tetrabutylammonium chloride (7 parts) was added, and the thus-prepared mixture was stirred for 1 hour. The resultant precipitate was collected by filtration, washed with water, and then dried to obtain the following compound C2 (17 parts).

Compound C2

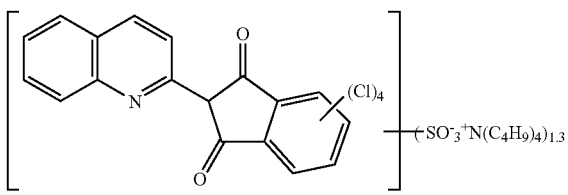

Synthesis Example C3

The procedure of Synthesis Example C1 was repeated likewise except for the use of C.I. Pigment Yellow 138 (50 parts) in place of tetrachloroquinophthalone (50 parts) to obtain the below-described compound C3 (56 parts), which was determined to contain on average 0.9 sulfonic groups introduced per molecule from the results of an elemental analysis for sulfur.

Compound C3

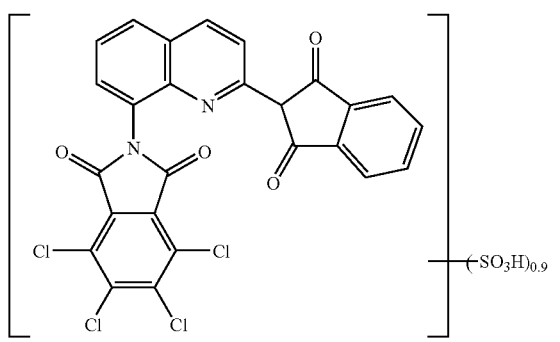

Synthesis Example C4

The procedure of Synthesis Example C2 was repeated likewise except for the use of a water paste (90 parts) of the compound C3 of Synthesis Example C3 in place of the water-based paste (90 parts) of the compound C1 of Synthesis Example C1 to obtain the following compound C4 (18 parts).

Compound C4

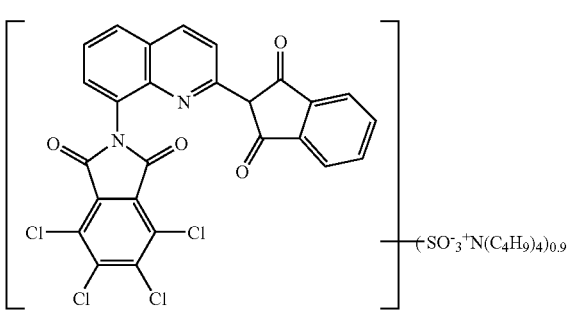

Example C1

To an acrylic resin varnish (a copolymerization product of methacrylic acid, butyl acrylate, styrene and hydroxyethyl acrylate at a molar ratio of 25/50/15/10, molecular weight: 12,000, solid content: 30%; 50 parts), a diketopyrrolopyrrole pigment (C.I. Pigment Red 254, 20 parts), an isoindoline yellow pigment (C.I. Pigment Yellow 139, 4 parts), the compound C1 (1 part) obtained in Synthesis Example C1, the pigment dispersant A5 (1 part) obtained above in Synthesis Example A4, a cationic resin dispersant ("AJISPUR PB-821", 4 parts) and "PGMAc" (20 parts) were added. Subsequent to premixing, the resultant mixture was dispersed in a horizontal bead mill to obtain a red-colored composition for color filters.

Example C2

A red-colored composition for color filters was obtained in a similar manner as in Example C1 except that instead of the compound C1, the compound C2 of Synthesis Example C2 was used.

Example C3

A red-colored composition for color filters was obtained in a similar manner as in Example C1 except that instead of the compound C1, the compound C3 of Synthesis Example C3 was used.

Example C4

A red-colored composition for color filters was obtained in a similar manner as in Example C1 except that instead of the compound C1, the compound C4 of Synthesis Example C4 was used.

Comparative Example C1

A red-colored composition for color filters was obtained in a similar manner as in Example C1 except that the pigment dispersant A5 was not used and only the compound C1 was used.

Comparative Example C2

A red-colored composition for color filters was obtained in a similar manner as in Example C1 except that the pigment dispersant A5 was not used and only the compound C2 was used.

Comparative Example C3

A red-colored composition for color filters was obtained in a similar manner as in Example C1 except that the pigment dispersant A5 was not used and only the compound C3 was used.

Comparative Example C4

A red-colored composition for color filters was obtained in a similar manner as in Example C1 except that the pigment dispersant A5 was not used and only the compound C4 was used.

The colored compositions of Examples C1 to C4 were compared in fluidity and the gloss of a color-coated surface with those of Comparative Examples C1 to C4. With respect to each colored composition for color filters, its fluidity and its gloss of a color-coated surface were measured by the same methods as those described above. The measurement results of the colored compositions of Examples C1 to C4 were assessed relative to those of the colored compositions of Comparative Examples C1 to C4. The results of the above measurements and assessment are shown in Table C1.

TABLE C1

| Colored composition for color filters | Pigment dispersant | Viscosity (mPa·s) Before storage | Viscosity (mPa·s) After storage | Gloss After storage |
|---|---|---|---|---|
| Ex. C1 | C1 + A5 | 12 | 13 | A |
| Ex. C2 | C2 + A5 | 9 | 10 | A |
| Ex. C3 | C3 + A5 | 11 | 10 | A |
| Ex. C4 | C4 + A5 | 16 | 16 | A |
| Comp. Ex. C1 | C1 | 52 | 263 | C |
| Comp. Ex. C2 | C2 | 37 | 190 | B |
| Comp. Ex. C3 | C3 | 45 | 174 | B |
| Comp. Ex. C4 | C4 | 51 | 148 | B |

As clearly envisaged from Table C1, the colored compositions of Examples C1 to C4, in which the compounds C1 to C4 were used in combination with the pigment dispersant A5, respectively, were lower in the viscosity both before and after storage (one month later) and better in gloss in comparison with the colored compositions of Comparative Examples C1 to C4 in which the compounds C1 to C4 were used singly, and therefore, were provided with excellent properties as colored compositions for color filters.

Example C5

To fabricate an RGB color filter, a red-, green- and blue-colored compositions were obtained in accordance with the formulations shown below in Table C2.

TABLE C2

| | Formulation (parts) R | G | B |
|---|---|---|---|
| Red-colored composition of Example C1 | 100 | — | — |
| Green-colored composition of Referential Example A1 | — | 100 | — |
| Blue-colored composition of Referential Example A2 | — | — | 100 |
| Acrylic resin varnish | 50 | 50 | 50 |
| Trimethylolpropane acrylate | 10 | 10 | 10 |
| 2-Hydroxy-2-methylpropiophenone | 2 | 2 | 2 |
| 2,2-Diethoxyacetophenone | 1 | 1 | 1 |
| PGMAc | 37 | 37 | 37 |
| Total | 200 | 200 | 200 |

Subsequently, a color filter having R, G and B pixels was obtained in a similar manner as in Example A5. The thus-obtained color filter had excellent spectral curve characteristics, was excellent in the durabilities such as light resistance and heat resistance, was also superb in light transmission properties, and exhibited outstanding properties as a color filter for a liquid-crystal color display.

Synthesis Example D1

In a manner known per se in the art, 3-hydroxy-2-naphthoic acid (60 parts) was converted into an acid chloride with thionyl chloride (40 parts) in nitrobenzene (400 parts), 2,5-dichloro-1,4-phenylenediamine (25 parts) was added, and the resulting mixture was heated at 130 to 135° C. for 5 hours. Subsequent to cooling, methanol (200 parts) was added. The resulting precipitate was collected by filtration, washed with methanol and then with water, and dried to obtain a reaction product (60 parts). To an aliquot (10 parts) of the reaction product, methanol (100 parts), sodium hydroxide (3 parts) and sodium acetate trihydrate (11 parts) were added to prepare a grounder solution. p-Aminobenzenesulfonic acid (3.5 parts) was diazotized by a method known per se in the art, and the diazotized reactant was then caused to couple to the grounder solution. One hour later, 2-chloro-5-trifluoromethylaniline (4.3 parts) was diazotized by a method known per se in the art, and the diazotized reactant was also caused to couple to obtain the below-described compound D1 (11 parts), which was determined to contain on average 1 sulfonic group introduced per molecule from the results of an elemental analysis for sulfur.

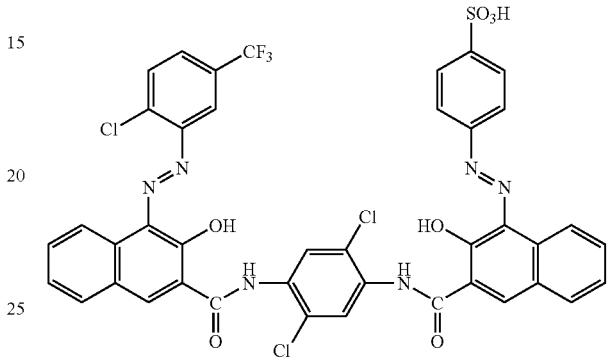

Compound D1

Synthesis Example D2

In a similar manner as in Synthesis Example D1 except for the use of 3,3'-dichlorobenzidine (35 parts) in place of 2,5-dichloro-1,4-phenylenediamine (25 parts), there was obtained the below-described compound D2 (11 parts), which was determined to contain on average 1 sulfonic group introduced per molecule from the results of an elemental analysis for sulfur.

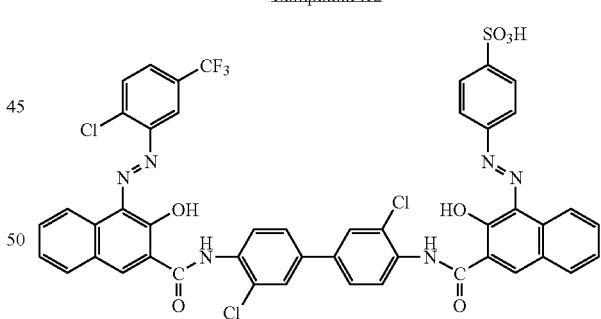

Compound D2

Example D1

To an acrylic resin varnish (a copolymerization product of methacrylic acid, butyl acrylate, styrene and hydroxyethyl acrylate at a molar ratio of 25/50/15/10, molecular weight: 12,000, solid content: 30%; 50 parts), a diketopyrrolopyrrole pigment (C.I. Pigment Red 254, 20 parts), an isoindoline yellow pigment (C.I. Pigment Yellow 139, 4 parts), the compound D1 (1 part) obtained in Synthesis Example D1, the pigment dispersant A5 (1 part) obtained above in Synthesis Example A4, a cationic resin dispersant ("SOLSPERS-24000", 4 parts) and "PGMAc" (20 parts) were added. Subsequent to premixing, the resultant mixture was dispersed in a horizontal bead mill to obtain a red-colored composition for color filters.

Example D2

A red-colored composition for color filters was obtained in a similar manner as in Example D1 except that instead of the compound D1, the compound D2 of Synthesis Example D2 was used.

Comparative Example D1

A red-colored composition for color filters was obtained in a similar manner as in Example D1 except that the pigment dispersant A5 was not used and only the compound D1 was used.

Comparative Example D2

A red-colored composition for color filters was obtained in a similar manner as in Example D1 except that the pigment dispersant A5 was not used and only the compound D2 was used.

The colored compositions of Examples D1 to D2 were compared in fluidity with those of Comparative Examples D1 to D2; and also the gloss of a color-coated surface obtained using those compositions were compared. With respect to each colored composition for color filters, its fluidity and its gloss of a color-coated surface were measured by the same methods as those described above. The measurement results of the colored compositions of Examples D1 to D2 were assessed relative to those of the colored compositions of Comparative Examples D1 to D2. The results of the above measurements and assessment are shown in Table D1.

TABLE D1

| Colored composition for color filters | Pigment dispersant | Viscosity (mPa · s) Before storage | Viscosity (mPa · s) After storage | Gloss After storage |
|---|---|---|---|---|
| Ex. D1 | D1 + A5 | 9 | 10 | A |
| Ex. D2 | D2 + A5 | 12 | 11 | A |
| Comp. Ex. D1 | D1 | 47 | 86 | C |
| Comp. Ex. D2 | D2 | 38 | 72 | B |

As clearly envisaged from Table D1, the colored compositions of Examples D1 to D2, in which the compounds D1 to D2 were used in combination with the pigment dispersant A5, respectively, were lower in the viscosity both before and after storage (one month later) and better in gloss in comparison with the colored compositions of Comparative Examples D1 to D2 in which the compounds. D1 to D2 were used singly; and therefore, were provided with excellent properties as colored compositions for color filters.

Example D3

To fabricate an RGB color filter, a red-, green- and blue-colored compositions were obtained in accordance with the formulations shown below in Table D2.

TABLE D2

| | Formulation (parts) | | |
|---|---|---|---|
| | R | G | B |
| Red-colored composition of Example D1 | 100 | — | — |
| Green-colored composition of Referential Example A1 | — | 100 | — |
| Blue-colored composition of Referential Example A2 | — | — | 100 |
| Acrylic resin varnish | 50 | 50 | 50 |
| Trimethylolpropane acrylate | 10 | 10 | 10 |
| 2-Hydroxy-2-methylpropiophenone | 2 | 2 | 2 |
| 2,2-Diethoxyacetophenone | 1 | 1 | 1 |
| PGMAc | 37 | 37 | 37 |
| Total | 200 | 200 | 200 |

Subsequently, a color filter having R, G and B pixels was obtained in a similar manner as in Example A5. The thus-obtained color filter had excellent spectral curve characteristics, was excellent in the durabilities such as light resistance and heat resistance, was also superb in light transmission properties, and exhibited outstanding properties as a color filter for a liquid-crystal color display.

This application claims the priorities-of Japanese Patent Applications 2005-045347 filed Feb. 22, 2005 and 2005-045348 filed Feb. 22, 2005, both of which are incorporated herein by reference.

The invention claimed is:

1. A pigment dispersant comprising the following component (a) alone or the following components (a) and (b) in combination:
   Component (a): a composite pigment formed of a diketopyrrolopyrrole pigment having a sulfonic group and another diketopyrrolopyrrole pigment having no sulfonic group, wherein the number of sulfonic group per molecule of said diketopyrrolopyrrole pigments in the composite pigment is from 0.05 to 0.5; and
   Component (b): a pigment other than said component (a), wherein said pigment has a sulfonic group or a metal salt, ammonium salt or amine salt thereof.

2. A pigment dispersant according to claim 1, wherein said component (b) is a compound represented by the following formula (I), formula (II), (III) or (IV) or a metal salt, ammonium salt and/or amine salt thereof:

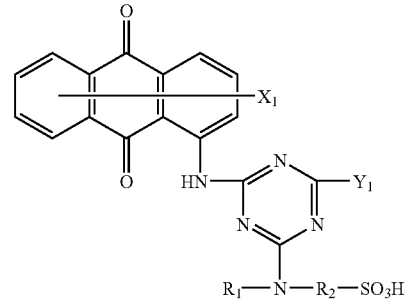

Formula (I)

wherein $X_1$ is a hydrogen or halogen atom or an alkyl or acylamino group, $Y_1$ is an anthraquinonylamino, phenylamino, naphtylamino or phenoxy group, said groups may each include one or more halogen atoms, alkyl groups and/or acylamino groups as substituents, $R_1$ is a hydrogen atom or an alkyl or phenyl group, and $R_2$ is a substituted or unsubstituted alkylene, phenylene or naphthylene group;

Formula (II)

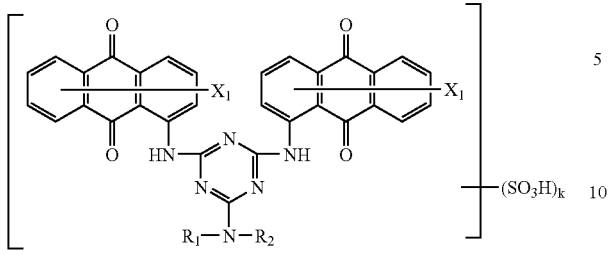

wherein $X_1$ is a hydrogen or halogen atom or an alkyl group, $R_1$ is a hydrogen atom or an alkyl or phenyl group, $R_2$ is a substituted or unsubstituted phenyl or naphthyl group, and k is an average number of sulfonic group(s) on said compound and is a number of from 0.5 to 2;

Formula (III)

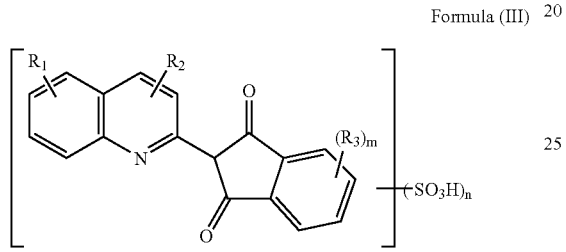

wherein $R_1$ is a hydrogen or halogen atom or a hydroxyl, alkyl, substituted or unsubstituted aryl, or substituted or unsubstituted phthalimido group, $R_2$ is a hydrogen atom or a hydroxyl group, $R_3$ is a halogen atom, m stands for an integer of from 0 to 4, and n is an average number of sulfonic group(s) introduced in said compound and is a number of from 0.5 to 4; or Formula (IV)

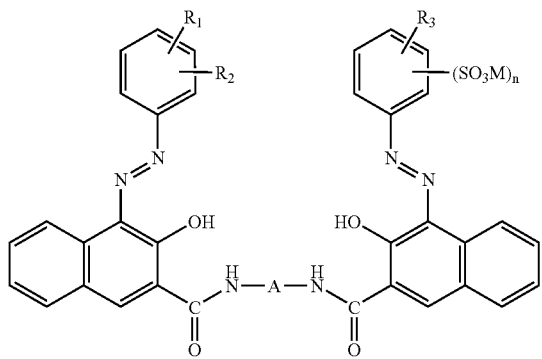

wherein A is

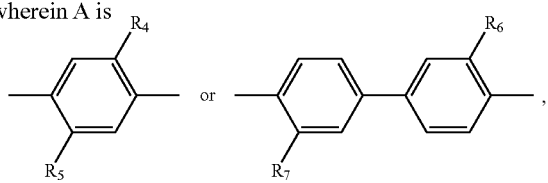

$R_1$ and $R_2$ each represents a hydrogen or halogen atom or a hydroxyl, alkyl, carboxyl, sulfonic or trifluoromethyl group, $R_3$ represents a hydrogen or halogen atom or a hydroxyl or alkyl group, $R_4$, $R_5$, $R_6$ and $R_7$ each represents a hydrogen or halogen atom or a methyl or cyano group, M represents a hydrogen or metal atom or an ammonium or amine group, and n stands for an integer of from 1 to 3.

3. A pigment dispersant according to claim 1, wherein said diketopyrrolopyrrole pigment having no sulfonic group is represented by the following formula (V):

Formula (V)

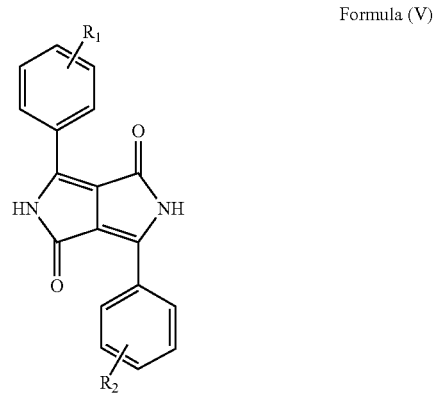

wherein $R_1$ and $R_2$ are each independently a hydrogen or halogen atom or a cyano, alkyl or phenyl group.

4. A pigment dispersant according to claim 1, wherein said sulfonic group in said diketopyrrolopyrrole pigment having said sulfonic group comprises at least one sulfonic group selected from a free sulfonic group and metal, amine and ammonium salts of a sulfonic group.

5. A pigment dispersant according to claim 2, wherein $R_2$ in the formula (I) is a group formed by eliminating an amino group from an amine selected from taurine, N-methyltaurine, o-aminobenzenesulfonic acid, m-aminobenzenesulfonic acid, sulfanilic acid, 4-chloroaniline-3-sulfonic acid, 2-nitroaniline-4-sulfonic acid, 2-aminophenol-4-sulfonic acid, o-anisidine-5-sulfonic acid, p-anisidine-5-sulfonic acid, o-toluidine-4-sulfonic acid, m-toluidine-4-sulfonic acid, p-toluidine-2-sulfonic acid, 2-chloro-p-toluidine-3-sulfonic acid, 3-amino-6-chloro-4-sulfobenzoic acid, 1-amino-8-naphthalenesulfonic acid, 2-amino-1-naphthalenesulfonic acid, 5-amino-1-naphthalenesulfonic acid, 6-amino-1-naphthalenesulfonic acid, or 5-amino-3-naphthalenesulfonic acid.

6. A pigment dispersant according to claim 2, wherein $R_2$ in the formula (II) is a group formed by eliminating an amino group from an amine selected from aniline, N-methylaniline, toluidine (o-, m- or p-), anisidine (o-, m- or p-), chloroaniline (o-, m- or p-), diphenylamine, 1-naphthylamine or 2-naphtylamine.

7. A pigment dispersant according to claim 1, wherein a weight ratio of said component (a) to said component (b), a:b, is from 10:90 to 90:10.

8. A colored composition for color filters, comprising a red pigment, a pigment dispersant according to claim 1, a resin dispersant, and a resin varnish.

9. A colored composition according to claim 8, wherein said red pigment is C.I. Pigment Red 254.

10. A colored composition according to claim 8, wherein said resin dispersant is a cationic resin dispersant.

11. A process for the fabrication of a color filter, said process including a step of forming color pixels on a substrate for said color filter, which comprises forming said color pixels with a colored composition according to claim 8.

12. A color filter fabricated by a process according to claim 11.

13. An image display device comprising a color filter according to claim 12.

14. An information communication equipment comprising an image display device according to claim 13.

* * * * *